United States Patent [19]

Mogi et al.

[11] 4,085,371
[45] Apr. 18, 1978

[54] AUTOMATICALLY TUNED MEMORY TELEVISION CHANNEL SELECTING APPARATUS

[75] Inventors: Takao Mogi, Tokyo; Koji Morita, Kodaira; Hisao Okada, Yokohama, all of Japan

[73] Assignee: Sony Corporation, Tokyo, Japan

[21] Appl. No.: 716,655

[22] Filed: Aug. 23, 1976

[30] Foreign Application Priority Data

Aug. 28, 1975 Japan .................................. 50-104445
Aug. 29, 1975 Japan .................................. 50-104556

[51] Int. Cl.² ............................................. H04B 1/06
[52] U.S. Cl. ..................................... 325/464; 325/468
[58] Field of Search ............................. 325/419–423, 325/452, 453, 457–459, 464, 465, 468, 470; 358/191, 193, 195; 340/347 AD

[56] References Cited

U.S. PATENT DOCUMENTS

| 3,594,765 | 7/1971 | Lerouge | 340/347 AD |
| 3,810,022 | 5/1974 | Collins | 325/464 |
| 3,928,808 | 12/1975 | Evans | 325/464 |
| 3,940,702 | 2/1976 | Yoshimura et al. | 325/464 |
| 3,968,440 | 7/1976 | Ehni | 325/464 |

Primary Examiner—Benedict V. Safourek
Assistant Examiner—Jin F. Ng
Attorney, Agent, or Firm—Lewis H. Eslinger; Alvin Sinderbrand

[57] ABSTRACT

In a channel selecting apparatus for a television receiver having an electronic tuning tuner for changing the receiving frequency in accordance with an analog control signal applied thereto; a memory has a plurality of addresses for storing respective digital codes each identifying a respective channel, and such addresses in the memory are selectively activated so as to effect read out of the respective channel identifying digital code to a digital-to-analog converter which converts the same into a respective analog control signal for the tuner. Deviation of the receiving frequency, as established in response to the analog control signal, from the correct receiving frequency for the channel identified by the digital code then being read out of the memory is detected, and in response to a detected deviation the ditial code being received by the digital-to-analog converter is automatically modified or changed in the sense for removing said deviation and thereby effecting a fine tuning operation. In a preferred embodiment, when the detected deviation of the established receiving frequency from the correct receiving frequency exceeds a predetermined amount, the resulting modified digital code is stored in the memory in place of the read out digital code resulting in such deviation, thereby to ensure that the stored digital codes will not, with time, result in respective receiving frequencies that are outside the pull-in range of the automatic fine-tuning operation.

12 Claims, 21 Drawing Figures

FIG. 7B $(M_1)$ 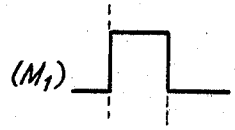
FIG. 7C $(P_G)$ 
FIG. 7D $(M_2)$ 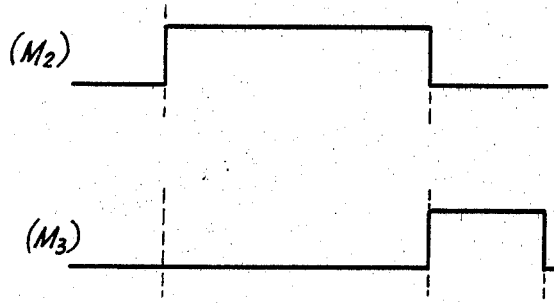
FIG. 7E $(M_3)$ 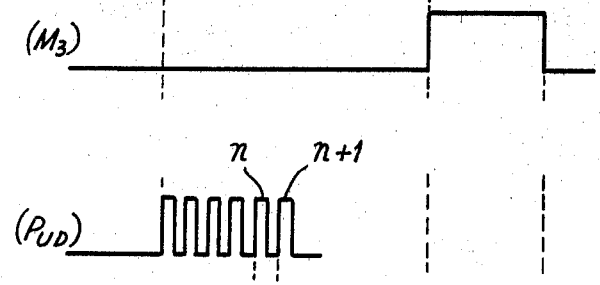
FIG. 7F $(P_{UD})$ 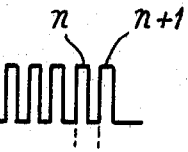

FIG. 7H $(M_4)$ 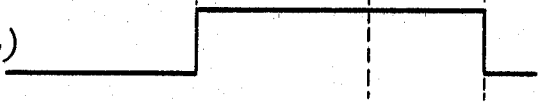
FIG. 7I $(P_M)$ 

AUTOMATICALLY TUNED MEMORY TELEVISION CHANNEL SELECTING APPARATUS

BACKGROUND OF THE INVENTION

1. Field of the Invention

This invention relates generally to channel selecting apparatus for a television receiver, and more particularly is directed to a channel selecting apparatus for a television receiver having a so-called electronic tuner employing, as its tuning element, a varactor or voltage-controlled, variable reactance device, such as, a variable capacitance diode.

2. Description of the Prior Art

Most existing television receivers employ electro-mechanical tuners in which a channel-selecting knob is manually rotatable through various positions established by a detent mechanism and which respectively correspond to the twelve vhf channels. At each of such positions of the knob, suitable switch contacts are engaged to activate a respective circuit by which the receiving frequency for the designated channel is obtained. Such electro-mechanical tuners are susceptible to failure because of loose or dirty switch contacts and defects in the detent mechanism. Furthermore, electro-mechanical tuners of the described type become extremely complex and even more unreliable when designed to tune the uhf channels in addition to the vhf channels.

In order to overcome the above problems of electro-mechanical tuners, so-called electronic tuners have been proposed for television receivers. In these proposed electronic tuners, a varactor, that is, an analog voltage-controlled, variable reactance device, such as, a variable capacitance diode, is employed as the tuning element, and the control voltage therefor is usually obtained either by means of a potentiometer array or a phase-locked loop arrangement. In the case of the potentiometer array, a number of potentiometers are connected between a stable voltage supply and ground, and each potentiometer is adjusted to provide a voltage which, when applied to the varactor by way of a respective solid state switch, will tune the receiver to a respective one of the local channels. Further, manually operable switches are provided to control the solid state switches associated with the several potentiometers. In the foregoing arrangement, it is difficult and costly to obtain stable potentiometers, and rather elaborate mechanical assemblies are required to provide for the adjustment of the several potentiometers so as to correspond to respective local channels.

In the existing electronic tuners employing a varactor with a phase-locked loop, the variable frequency output of the varactor controlled tuner is applied through an amplifier to a prescaler which divides such output frequency by a fixed number, and the resulting divided frequency is then further divided, in a variable counter or divider, by a number that is determined by a preset logic controlled by manually operable channel-selector switches. The output of the variable counter or divider is then compared, in a phase comparator, with a stable reference frequency obtained, for example, from a crystal-controlled oscillator, with the resulting error signal being used to control or vary the control voltage for the varactor. The foregoing phase-locked loop arrangement is disadvantageous in that the amplifier used to raise the low level of the output of the tuner for driving the digital prescaler may be costly, and further in that such prescaler has to operate at an undesirably high input frequency.

Two of the present inventors have developed a channel selecting apparatus for a television receiver having a tuner with a voltage-controlled variable reactance device as its tuning element and which avoids the above described problems, for example, as disclosed in U.S. patent application Ser. No. 716,702, filed Aug. 23, 1976 and corresponding to Japanese Patent Application No. 103,668/75, filed Aug. 27, 1975. In such channel selecting apparatus, digital or binary codes representing or identifying respective channels are stored at respective addresses in a memory, and a digital-to-analog converter provides an analog control voltage for the variable reactance device in correspondence to each digital code selectively read out of the memory in a channel selecting mode of the apparatus. Further, in a programming mode of the apparatus, the changing digitally coded counts of a counter which is counting sweep pulses are applied to the digital-to-analog converter for similarly controlling the variable reactance device and selected counts of the counter, for example, those which result in the appearance on the receiver screen of pictures or test patterns broadcast by selected television stations or channels, are written at selected addresses in the memory as the channel identifying codes. Although the foregoing channel selecting apparatus is provided with a sweep pulse generating circuit which is actuable to provide either coarse or fine sweep pulses to be counted in the programming mode for establishing the channel identifying codes to be written or stored at selected addresses of the memory, the selection of each channel identifying code to be stored is made by visually observing the picture or image appearing on the screen of the television receiver and, therefore, the stored code may not be the optimum code for obtaining precise tuning to the respective channel.

OBJECTS AND SUMMARY OF THE INVENTION

Accordingly, it is an object of this invention to provide an improved channel selecting apparatus for a television receiver having a tuner with a varactor or voltage-controlled variable reactance device as its tuning element, and in which the above described problems and disadvantages of the previously proposed channel selecting apparatus for electronic tuners are avoided.

More particularly, it is an object of this invention to provide a channel selecting apparatus, as aforesaid, which can be easily and inexpensively formed as an integrated circuit, and which is capable of tuning the associated television receiver to any desired channel with very high accuracy and reliability.

Another object is to provide a channel selecting apparatus, as aforesaid, which is devoid of any potentiometers or variable resistors for establishing the control voltage of the varactor, thereby to avoid the problems that may arise from the high contact resistance or changes in the resistance value of potentiometers that can occur due to vibration, temperature variations or simply with time.

Still another object is to provide a channel selecting apparatus, as aforesaid, which may be very simply and quickly preset or programmed for determining the local channels that are to be received.

A further object is to provide a channel selecting apparatus, as aforesaid, with an automatic fine tuning operation.

A still further object is to provide a channel selecting apparatus, as aforesaid, in which the automatic fine tuning operation is reliably achieved even though the voltage-controlled variable reactance device of the tuner has a non-linear relation between its control voltage and the resulting receiving frequency over the range of the receiving frequencies, and even though the relation of the control voltage for the variable reactance device to the resulting receiving frequency may vary with temperature or the time of year.

In accordance with an aspect of this invention, a channel selecting apparatus for a television receiver having an electronic tuning tuner for changing the receiving frequency in accordance with an analog control signal applied thereto is provided with a memory having a plurality of addresses for storing respective digital codes each identifying a respective channel, addressing means for selectively activating each of the addresses in the memory so as to effect read out of the respective channel identifying digital code, a digital-to-analog converter receiving the digital code being read out of the memory for converting the same into a respective analog control signal for the tuner, means for detecting deviation of the receiving frequency, as established in response to the analog control signal, from the correct receiving frequency for the channel identified by the digital code than being read out of the memory, and means responsive to a detected deviation of the established receiving frequency from the correct receiving frequency for modifying the digital code being received by the digital-to-analog converter in the sense for removing said deviation, whereby to effect an automatic fine tuning operation.

Further, the channel selecting apparatus according to this invention, as described above, is preferably provided with means operative, when the detected deviation of the established receiving frequency from the correct receiving frequency exceeds a predetermined amount, to store the resulting modified digital code in the memory in place of the read out digital code resulting in said deviation so that the receiving frequency established at any time in response to a channel identifying code read out of the memory will remain within the pull-in range of the automatic fine tuning operation.

The above, and other objects, features and advantages of the invention, will be apparent in the following detailed description of illustrative embodiments thereof which is to be read in connection with the accompanying drawings.

BRIEF DESCRIPTION OF THE DRAWINGS

FIGS. 6A-6C and FIGS. 7A-7I are waveform diagrams to which reference will be made in explaining the automatic fine tuning operation of the channel selecting apparatus according to this invention.

DESCRIPTION OF A PREFERRED EMBODIMENT

Figure 1:
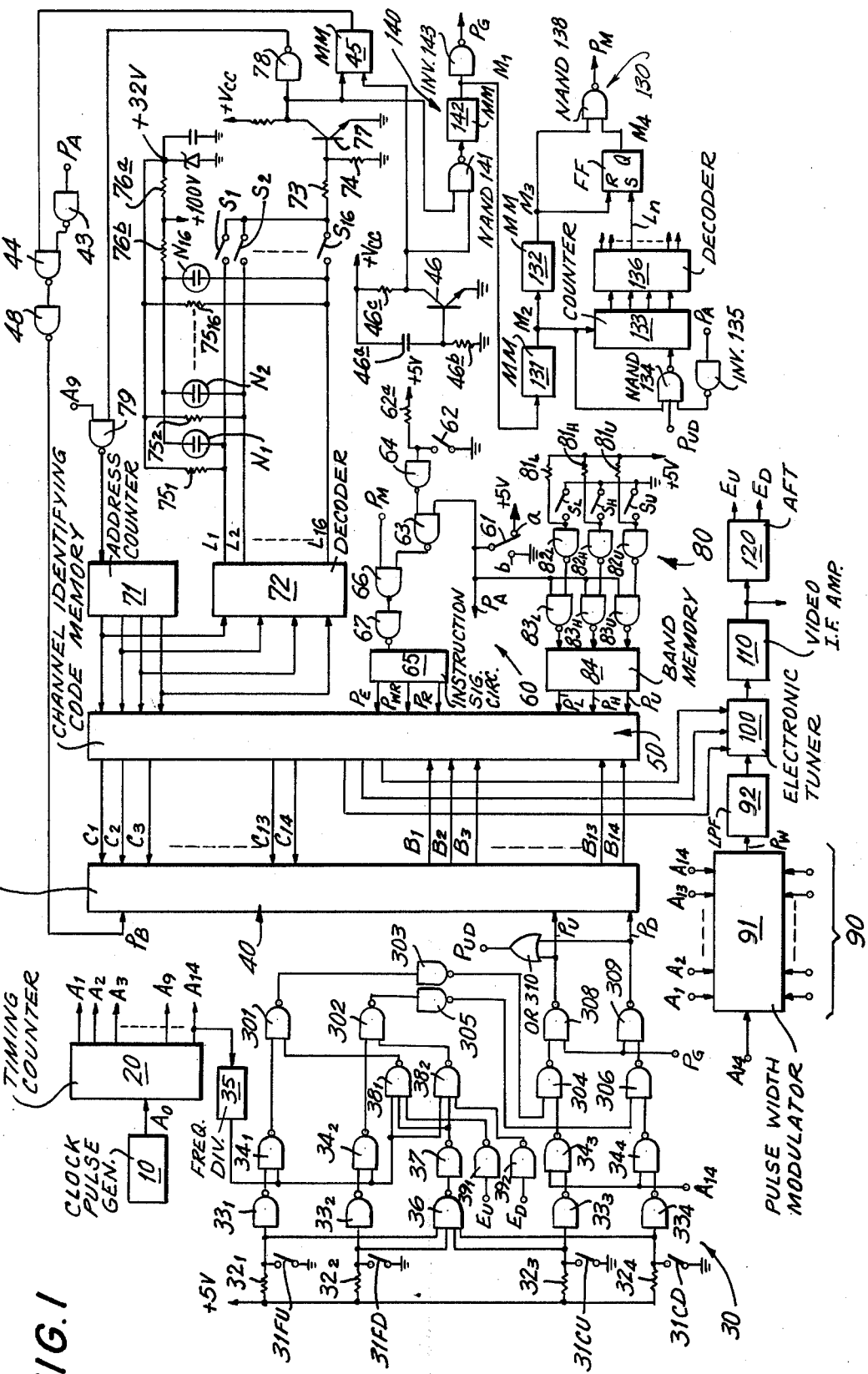
FIG. 1 is a block diagram illustrating a channel selecting apparatus according to an embodiment of this invention.

Referring to the drawings in detail, and intially to FIG. 1 thereof, it will be seen that a channel selecting apparatus according to this invention is there illustrated to generally comprise a generator 10 of a clock pulse $A_o$ which is applied to a timing counter 20 for producing a circulating digital or binary code $A_1$, $A_2$, $A_3$-$A_{14}$; a sweep pulse generating circuit 30 which is manually controllable to selectively produce up-sweep pulses $P_U$ or down-sweep pulses $P_D$; and an up-down counter 40 which, in a programming mode of the apparatus, counts the sweep pulses $P_U$ or $P_D$ to establish channel identifying digital codes $B_1$, $B_2$, $B_3$-$B_{14}$ corresponding to the changing counts of counter 40 and which may be selectively written at selected addresses in a memory 50. Further, the channel selecting apparatus according to this invention, as shown on FIG. 1, generally comprises a memory control circuit 60 for selectively establishing the previously mentioned programming mode of operation or a channel selecting mode of operation in which a channel identifying digital code previously written or stored at a selected address in memory 50 is read out therefrom, as indicated at $C_1$, $C_2$, $C_3$-$C_{14}$, with such read out code being applied to counter 40 for establishing the corresponding count in the latter; an address selecting circuit 70 that is manually controllable for activating a selected address in memory 50 for either the writing of a selected channel identifying code at such address or the reading out of a previously stored channel identifying code from the selected address during the programming or channel selecting modes, respectively; and a band indicating signal forming circuit 80 which, in the programming mode of operation, is selectively operable to produce a signal indicating the band of the channel indicating code then being written or stored at a selected address of memory 50, with such band indicating signal being also written or stored at the respective address. The channel selecting apparatus shown in FIG. 1 also generally comprises a digital-to-analog converter 90 which provides an analog control voltage for the varactor of a selected band in an electronic tuner 100 in correspondence to the count of counter 40 established by a channel identifying digital code selectively read out of memory 50 in a channel selecting mode of the apparatus, or in correspondence to the changing counts of counter 40 produced when the latter counts sweep pulses from generating circuit 30 in the programming mode of the apparatus; and a video intermediate frequency amplifier 110 which receives the tuned frequency output of tuner 100 and has its output applied to a conventional video detector circuit (not shown) as in the usual color television receiver.

In accordance with this invention, the output of video intermediate frequency amplifier 110 is also applied to an automatic fine tuning (AFT) circuit 120 which frequency-discriminates a video carrier wave in the output of IF amplifier 110 and produces a corresponding AFT voltage from which discriminated outputs $E_U$ and $E_D$ are selectively derived, as hereinafter described in detail, so as to indicate that the channel identifying code then being applied to converter 90 for establishing a receiving frequency in the channel selecting mode of the apparatus has to be modified upwardly or downwardly, respectively, for attaining precisely the correct receiving frequency for the respective channel. The discriminated outputs $E_U$ and $E_D$ are applied to sweep pulse generating circuit 30 which, as hereinafter described in detail, responds to the discriminated output $E_U$ or $E_D$ to provide sweep pulses which are counted by counter 40 for modifying the channel identifying code applied therefrom to converter 90 in the direction to obtain precisely the correct receiving frequency, that is, for achieving the desired AFT operation.

Further, in accordance with this invention, a memory rewriting circuit 130 is provided in the channel selecting apparatus and as hereinafter described in detail, is operative, when the extent to which the channel identifying code being read out of a selected address in memory 50 to counter 40 has to be modified for obtaining the correct receiving frequency for the respective channel exceeds a predetermined amount, to cause the writing of the modified channel identifying code at the selected address in place of the code originally stored thereat. Thus, the memory rewriting circuit 130 ensures that the channel identifying codes stored in memory 50 will not, with time, result in respective receiving frequencies that are outside the pull-in range of the AFT operation. Finally, the channel selecting apparatus according to this invention is shown to comprise an AFT inhibit circuit 140 which is effective, as hereinafter described in detail, to prevent the AFT operation during the initial application of power to the apparatus and during operation of the address selecting circuit 70.

Figure 4:
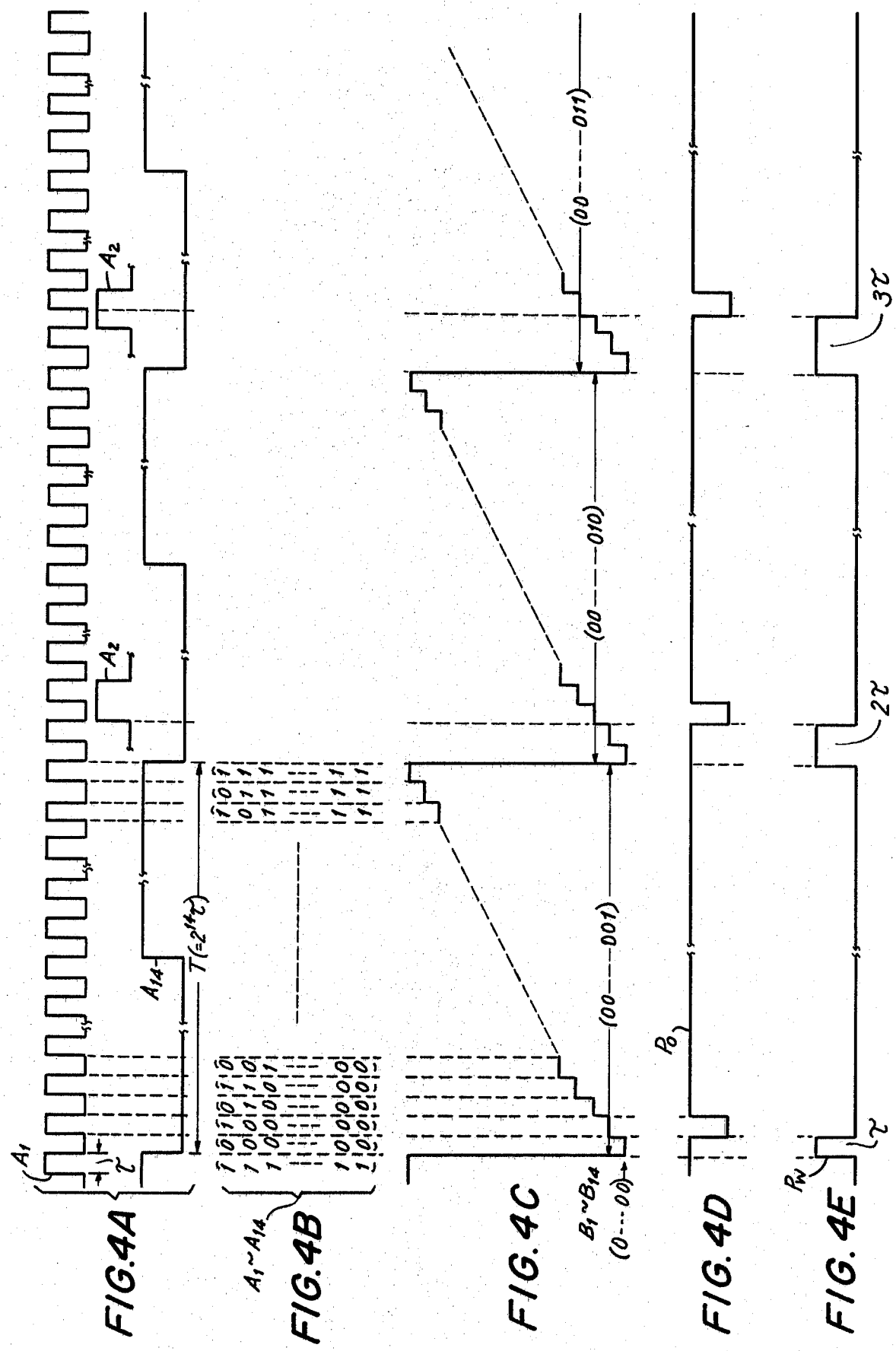
FIGS. 4A-4E are waveform diagrams to which reference will be made in explaining the operation of the channel selecting apparatus of FIG. 1.

In the channel selecting apparatus as generally described above, the clock pulse $A_o$ from generator 10 may have a frequency of, for example, 4 MHz resulting in a period $\tau$ of 0.25 $\mu$sec. In the timing counter 20, such clock pulse $A_o$ is counted to produce pulses $A_1$, $A_2$, $A_3$–$A_{14}$ which are frequency-divided in sequence so as to range from the pulses $A_1$ having a period of 0.5 $\mu$sec. and a pulse width of 0.25 $\mu$sec., to the pulses $A_{14}$ having a period of 4.096 m.sec. and a pulse width of 2.048 m.sec., thereby to form a 14-bit circulating digital code constituted by the pulses $A_1$, $A_2$, $A_3$–$A_{14}$. It will be apparent that such 14-bit circulating digital code changes its state $2^{14}$ times, that is, 16,384 times, within the circulating or repeating period of $T = 2^{14}\tau = 4.096$ m.sec. (FIGS. 4A and B).

In the sweep pulse generating circuit 30 as shown on FIG. 1, a fine up-sweep switch 31FU, a fine down-sweep switch 31FD, a coarse up-sweep switch 31CU and a coarse down-sweep switch 31CD are connected in series circuits with respective resistors $32_1$, $32_2$, $32_3$ and $32_4$, and such series circuits are connected in parallel between a voltage source +5V and ground. The switches 31FU, 31FD, 31CU and 31CD are normally open, as shown, to provide signals at the relatively high level "1" at the junctions of such switches with the respective resistors $32_1$, $32_2$, $32_3$ and $32_4$. Further, the switches 31FU, 31FD, 31CU and 31CD are adapted to be selectively manually displaced to the closed condition thereof for providing a signal at the low level "0" at the junction of the closed switch with the respective resistor $32_1$–$32_4$. Such signals "1" or "0" from switches 31FU, 31FD, 31CU and 31CD are applied through inverters $33_1$, $33_2$, $33_3$ and $33_4$ to first inputs of NAND circuits $34_1$, $34_2$, $34_3$ and $34_4$, respectively. The pulses $A_{14}$ having a period of 4.096 m.sec. are applied from timing counter 20, as coarse sweep pulses, to second inputs of NAND circuits $34_3$ and $34_4$. Further, the pulses $A_{14}$ from timing counter 20 are applied to a frequency divider 35 so as to be divided in the latter, for example, by 64, for providing fine sweep pulses having a period of 262.144 m.sec. and such fine sweep pulses are applied to second inputs of NAND circuits $34_1$ and $34_2$.

The signals "1" or "0" from switches 31FU, 31FD, 31CU and 31CD are also all applied to a NAND circuit 36 which has its output connected to an inverter 37 to provide an inverted output which is, in turn, applied to NAND circuits $38_1$ and $38_2$. The NAND circuits $38_1$ and $38_2$ both also have applied thereto the fine sweep pulses from frequency divider 35. Further, the discriminated outputs $E_U$ and $E_D$ from AFT circuit 120 are applied to inverters $39_1$ and $39_2$, respectively, which have their outputs applied to NAND circuits $38_1$ and $38_2$, respectively. The outputs of NAND circuits $34_1$ and $38_1$ are applied to a NAND circuit 301, while the outputs of NAND circuits $34_2$ and $38_2$ are similarly applied to a NAND circuit 302. The output of NAND circuit 301 is applied through an inverter 303 to a NAND circuit 304 which also receives the output of NAND circuit $34_3$, and the output of NAND circuit 302 is similarly applied through an inverter 305 to a NAND circuit 306 which also receives the output of NAND circuit $34_4$. The outputs of NAND circuits 304 and 306 are respectively applied to NAND circuits 308 and 309 which each also receive an AFT inhibit pulse $P_G$ from circuit 140, and the outputs of NAND circuits 308 and 309 are applied as up-sweep pulses $P_U$ and down-sweep pulses $P_D$, respectively, to counter 40. Further, the outputs of NAND circuits 308 and 309 are connected to an OR circuit 310 for providing pulses $P_{UD}$ to memory rewriting circuit 130.

Figure 2:
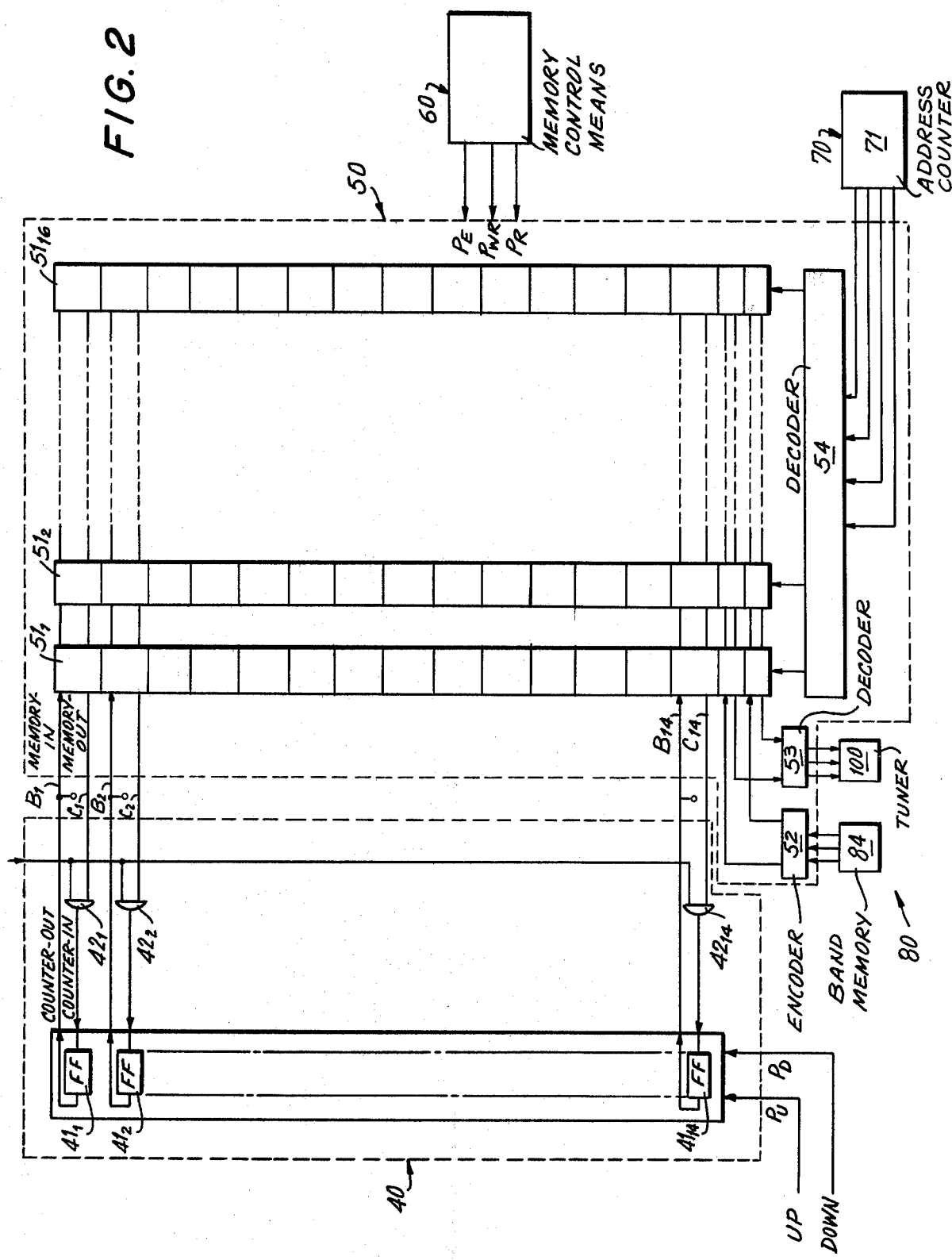
FIG. 2 is a block diagram illustrating, in greater detail, an up-down counter for generating channel identifying codes and a memory which are included in the apparatus of FIG. 1.

As shown schematically on FIG. 2, the counter 40 may be a conventional 14-bit up-down counter having 14 flip-flops $41_1$, $41_2$–$41_{14}$ which have their states changed sequentially in the up or down direction when counting the up-sweep pulses $P_U$ or the down-sweep pulses $P_D$, respectively, to establish the respective bits of sequentially changing 14-bit channel identifying codes $B_1$, $B_2$–$B_{14}$. In the programming mode of operation, the channel identifying codes are applied from counter 40 to memory 50 for writing or storage of a selected one of such codes at a selectively activated address in the memory, and the sequentially changing channel identifying codes are also applied from counter 40 to digital-to-analog converter 90 for providing a correspondingly varied control voltage for the varactor in a selected band of electronic tuner 100. The flip-flops $41_1$–$41_{14}$ of counter 40 are further adapted, in the channel selecting mode of operation, to have their respective states established by the respective bits $C_1$–$C_{14}$ of a memorized channel identifying code which are read out of a selectively activated address in memory 50 to AND circuits $42_1$–$42_{14}$ which also receive a load pulse $P_B$ during the channel selecting operation for passing the bits read out of the memory, as hereinafter described in detail, and which have their outputs respectively connected to flip-flops $41_1$–$41_{14}$.

As also shown on FIG. 2, the memory 50 may be desirably comprised of 16 memory units $51_1$, $51_2$–$51_{16}$ at respective addresses in memory 50, with the memory unit at each address being capable of storing 16-bits of digital information, that is, the 14-bits of a selected channel identifying code from counter 40 and 2-bits from an encoder 52 for the band indicating signal received from circuit 80 for indicating whether the channel identified by the 14-bit digital code being stored at the respective address is a vhf or uhf channel, and, if it is a vhf channel, whether it is a low channel or a high channel in such broadcast band, respectively. Further, the memory 50 is schematically shown to include a decoder 53 which, in the programming and channel selecting modes of operation, receives the 2-bits of digital information representing the band of the channels identified by the 14-bit codes being applied to, or read out from, respectively, the memory units for providing a corresponding band identifying signal applied to electronic tuner 100 for selecting the corresponding band of the latter. Finally, the memory 50 is schematically shown to include a decoder 54 which receives a 4-bit digital code from the address selecting circuit 70, as hereinafter described in detail, and which is effective to activate or address the corresponding one of the memory units $51_1$, $51_2$–$51_{16}$. Preferably, the memory units of memory 50 are composed of non-volatile cells, such as, metal-nitride-oxide-silicon (MNOS) elements, so that the contents thereof, while being electrically alterable, are held unchanged during periods when memory 50 is disconnected from a source of power.

Returning again to FIG. 1, it will be seen that the memory control 60 include a mode change-over switch 61 having a movable contact that is manually actuable to selectively engage fixed contacts $a$ and $b$. The fixed contact $a$ is connected to a voltage source +5V so that, when the movable contact of switch 61 engages fixed contact $a$ to establish the programming mode of operation, a signal $P_A$ at the relatively high level "1" is obtained from switch 61. On the other hand, the fixed contact $b$ of switch 61 is connected to ground so that, when the movable contact of switch 61 is engaged with fixed contact $b$ for establishing the channel selecting mode of operation, the signal $P_A$ is at the relatively low level "0". Memory control 60 is further shown to have a normally open switch 62 which is connected in series with a resistor $62a$ between a voltage source +5V and ground. The signal $P_A$ from mode change-over switch 61 is shown to be applied to one input of a NAND circuit 63 which has its other input connected through an inverter 64 with a junction in the connection between switch 62 and resistor $62a$. It will be apparent that, when switch 62 is in its normally open position, as shown, the output of inverter 64 will be at the low level "0", whereas, when switch 62 is manually closed to effect a writing operation with the apparatus in its programming mode, the output of inverter 64 will be at the relatively high level "1". The output of NAND circuit 63 is shown to be applied to a NAND circuit 66 along with a rewrite instruction signal $P_M$ from circuit 130, and the output of NAND circuit 66 is applied through an inverter 67 to an instruction signal forming circuit 65. When the output of NAND circuit 63 or the instruction signal $P_M$ is at the low level "0", circuit 65 supplies an erasing pulse $P_E$ and then a writing pulse $P_{WR}$ to the memory unit at a selected address in memory 50 so as to erase the previously stored contents in such memory unit and, thereafter, to write in the selected memory unit the 14-bit channel identifying code then being received from counter 40 and the 2-bit code which represents the band of the channel identified by the code being written in the respective memory unit. On the other hand, when the output of NAND circuit 63 and the instruction signal $P_M$ are at the high level "1", instruction signal forming circuit 65 applies a read pulse $P_T$ to memory unit 50 so as to effect the read out of the contents stored in the memory unit which is then selected.

The band indicating signal forming circuit 80 is shown to include normally open switches $S_L$, $S_H$ and $S_U$ which are connected in series with respective resistors $81_L$, 81H and $81_U$ between a voltage source +5V and ground. Junctions between switches $S_L$, $S_H$ and $S_U$ and the respective resistors are connected to inverters $82_L$, $82_H$ and $82_U$, respectively, which have their outputs connected to first inputs of NAND circuits $83_L$, $83_H$ and $83_U$, respectively, while the second inputs of such NAND circuits receive the signal $P_A$ from mode change-over switch 61. The outputs of NAND circuits $83_L$, $83_H$ and $83_U$ are applied to a band memory 84 which is effective to apply a band indicating signal $P_L$, $P_H$ or $P_U$ to encoder 52 in memory 50 in response to a low level or "0" output from the NAND circuit $83_L$, $83_H$ or $83_U$, respectively. It will be apparent that, in the programming mode of operation established by engagement of switch 61 with its fixed contact $a$ to provide the signal $P_A$ with the high value "1", the output of the NAND circuit $83_L$, $83_H$ or $83_U$ has the low value "0" only when the respective switch $S_L$, $S_H$ or $S_U$ is manually closed for indicating that the channel identified by the 14-bit code to be written at a selected address in memory 50 is a low vhf channel, a high vhf channel or a uhf channel, respectively.

The address selecting circuit 70 of the illustrated channel selecting apparatus according to this invention includes 16 normally open address selecting switches $S_1$, $S_2$–$S_{16}$ which are each selectively manually actuable to the closed condition for selecting a corresponding one of the 16 addresses or memory units in memory 50 to be activated during a programming operation or channel selecting operation of the apparatus. The address selecting circuit 70 is further shown to include neon tubes or other indicators $N_1$, $N_2$–$N_{16}$ corresponding to the switches $S_1$, $S_2$–$S_{16}$, and address counter 71 which, in respone to the closing of a selected one of the switches $S_1$–$S_{16}$, produces a corresponding 4-bit addressing code applied to the decoder 54 in memory 50 for addressing the corresponding memory unit in the latter, and a decoder 72 which receives the coded output of address counter 71 and, in response thereto, provides a "0" output signal on a respective one of 16 output lines $L_1$, $L_2$–$L_{16}$. The switches $S_1$–$S_{16}$ are connected, at one side, in common, through series resistors 73 and 74 to ground, while the opposite sides of switches $S_1$–$S_{16}$ are connected to lines $L_1$–$L_{16}$, respectively. Further, the lines $L_1$–$L_{16}$ are connected through resistors $75_1$–$75_{16}$, respectively, and a common resistor $76a$ with a voltage source +100V, while the neon tubes or indicators $N_1$–$N_{16}$ are connected between the lines $L_1$–$L_{16}$, respectively, and the same voltage source +100V through a common resistor $76b$. The junction between series-connected resistors 73 and 74 is connected to the base electrode of a switching transistor 77 having its emitter electrode connected to ground and its collector electrode connected to a voltage source $+V_{cc}$ and to an inverter 78. The output of inverter 78 is connected to one input of a NAND circuit 79 which, at its other input, receives the pulses $A_9$ produced by timing counter 20 and having a period of 0.128 m.sec. Finally, the output of NAND circuit 79 is applied to address counter 71 which is operative to count each "0" output of NAND circuit 79.

In order to provide the load pulse $P_B$ to AND circuits $42_1$-$42_{14}$ of counter 40 for read out to the latter of the channel identifying code $C_1$-$C_{14}$ stored in a selected memory unit of memory 50 in the channel selecting mode of operation, the illustrated apparatus according to this invention is further shown to include an inverter 43 receiving the signal $P_A$ from memory control 60 and having its output connected to one of the inputs of a NAND circuit 44 which, at its other input, is connected to the output of a monostable multivibrator 45 triggered by a relatively high collector output "1" from transistor 77 or from a transistor 46 of a time constant circuit 47. The output of NAND circuit 44 is connected to an inverter 48 which, in turn, has its output connected to AND circuits $42_1$-$42_{14}$ of counter 40 so that the load pulse $P_B$ is produced when the output of NAND circuit 44 is "0", that is, when signal $P_A$ has the value "0" for the channel selecting mode of operation and monostable multivibrator 45 is triggered to produce a pulse having the value "1" for a predetermined period of, for example, 50 m.sec. In the time constant circuit 47, the base electrode of transistor 46 is shown to be connected between a capacitor 46a and a resistor 46b which are connected, in series, between the voltage source $+V_{cc}$ and ground, while the collector of transistor 46 is connected through a resistor 46c with the voltage source and the emitter electrode of transistor 46 is connected to ground. Therefore, when the apparatus is initially connected to a power source, transistor 46 is made conductive and, hence its collector output is "0". After a predetermined lapse of time, for example, of 50 m.sec., transistor 46 is turned off so that its collector output rises to the value "1" for triggering monostable multivibrator 45 which then provides its output for the predetermined time of 50 m.sec.

In the channel selecting apparatus according to this invention, the digital-to-analog converter 90 preferably includes a pulse-width modulator 91 operative to produce a chain of pulses at a predetermined repetition rate with the width of each of such pulses being dependent on the channel identifying code $B_1$, $B_2$-$B_{14}$ obtained from counter 40 either in response to the counting by the latter of the sweep pulses from generating circuit 30 or in response to the read out of a channel identifying code stored at a selected address in memory 50, and a low pass filter 92 which receives the chain of pulses from modulator 91 for providing the analog control voltage for a varactor of electronic tuner 100 in dependence on the modulated width of the pulses. More particularly, the pulse-width modulator 91 determines the pulse width of the chain of pulses applied to low pass filter 92 in dependence on the absence of coincidence between the channel identifying $B_1$, $B_2$-$B_{14}$ obtained from counter 40 and the circulating digital code $A_1$, $A_2$-$A_{14}$ applied to modulator 91 from timing counter 20.

Figure 3:
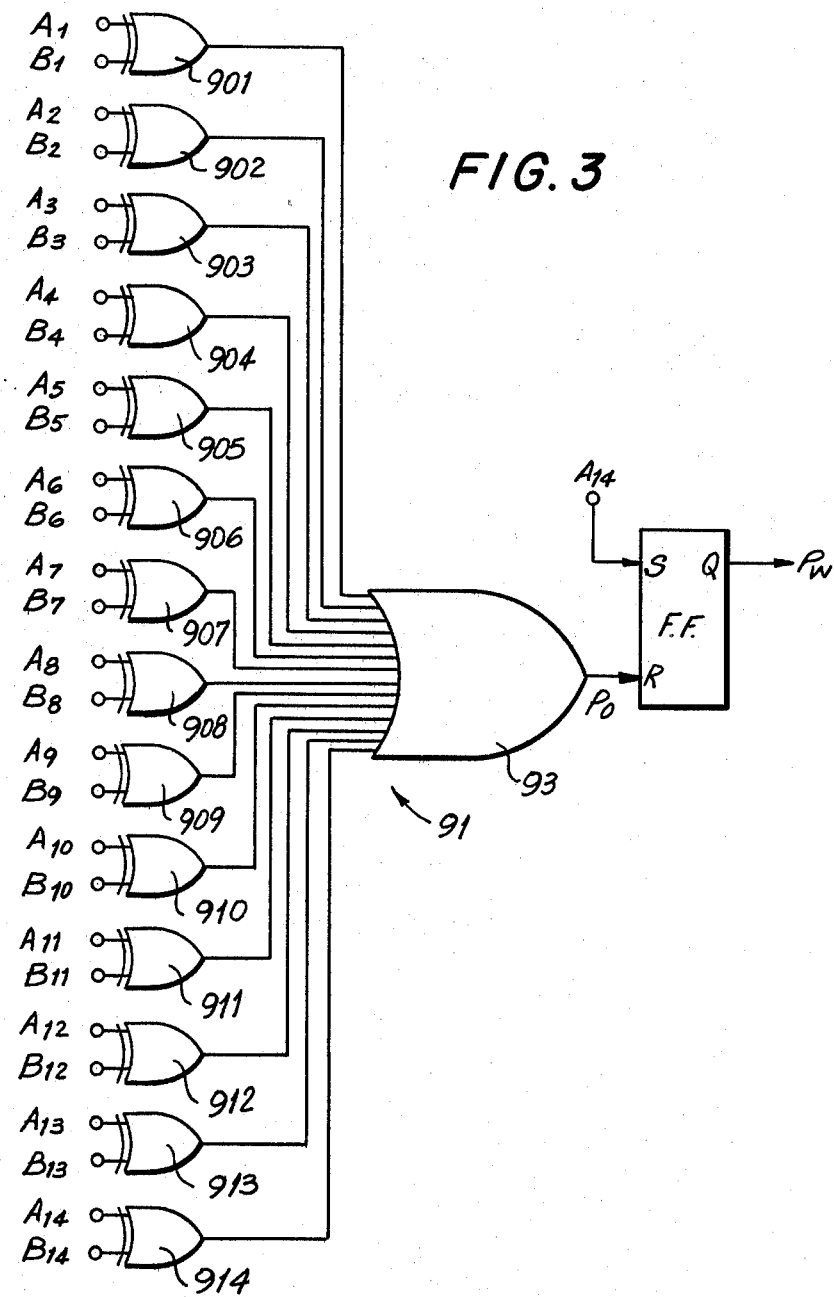
FIG. 3 is a detail block diagram of a pulse-width modulator which is included in the apparatus shown on FIG. 1.

As shown on FIG. 3, the pulse-width modulator 90 may advantageously include 14 exclusive OR circuits $901$,$902$-$914$ having first and second inputs which respectively receive the bits or pulses $A_1$, $A_2$-$A_{14}$ of the circulating code and the bits $B_1$, $B_2$-$B_{14}$ of the channel identifying code. The outputs of all of the exclusive OR circuits 901-914 are applied through an OR circuit 93 to the reset terminal R of a flip-flop 94 which has the pulse $A_{14}$ with a period of 4.096 m.sec. applied from timing counter 20 to the set terminal S of flip-flop 94. The flip-flop 94 is adapted to be set by the falling edge or side of each pulse $A_{14}$ so as to provide an output of value "1" at its output terminal Q, that is, to initiate an output pulse $P_W$. Further, flip-flop 94 is reset to terminate the output pulse $P_W$, that is, to return the output voltage to "0", in response to the falling edge or side of an output $P_O$ from OR circuit 93.

As is apparent from FIGS. 4B-4E, an output pulse $P_W$ is initiated at the output Q of flip-flop 94 when the circulating code $A_1$, $A_2$-$A_{14}$ returns from the state (11111111111111) to the state (00000000000000). So long as the circulating code $A_1$, $A_2$-$A_{14}$ is not coincident in level with the channel identifying code then being applied to pulse-width modulator 91, one or more of the exclusive OR circuits 901-914 produces an output "1" with the result that the output $P_O$ of OR circuit 93 remains at the level "1" (FIG. 4B). Upon the coincidence of all bits of the circulating code $A_1$, $A_2$-$A_{14}$ with the corresponding bits of the channel identifying code $B_1$, $B_2$-$B_{14}$ during each circulating period T of the circulating code, the outputs of all of the exclusive OR circuits 901-914 attain the value "0", with the result that the output $P_O$ of OR circuit 93 falls from the value "1" to the value "0" so as to reset flip-flop 94 and thereby return the output of the latter to the value "0". Thus, during each circulating period T of the circulating code $A_1$, $A_2$-$A_{14}$ from timing counter 20, an output pulse $P_W$, that is, an output of the value "1", is obtained from flip-flop 94 during the time interval between the return of the circulating code $A_1$, $A_2$-$A_{14}$ from the state (11111111111111) to the state (00000000000000) and the coincidence of the circulating code with the channel identifying code $B_1$, $B_2$-$B_{14}$. Therefore, when a change is effected in the channel identifying code $B_1$, $B_2$-$B_{14}$ being applied to pulse-width modulator 91, a corresponding change occurs in the width of the output pulse $P_W$ obtained from modulator 91 during each circulating period of the circulating code.

For example, as shown on the left-hand portions of FIGS. 4A-4E, if the channel identifying code $B_1$, $B_2$-$B_{14}$ applied to pulse-width modulator 91 is (00000000000001) the output pulse $P_W$ produced during each circulating period of the circulating code $A_1$, $A_2$-$A_{14}$ commences at the beginning of the circulating period, that is, when the circulating code returns from the state (11111111111111) to the state (00000000000000), and each such output pulse $P_W$ terminates at the commencement of the first pulse $A_1$, at which time the circulating code (00000000000001) coincides with the received channel identifying code (00000000000001) to cause the output $P_O$ of OR circuit 93 to fall from "1" to "0". Thus, the output pulse $P_W$ produced during each circulating period of the circulating code has a pulse width of $\tau$. On the other hand, as shown on the middle portion of FIGS. 4A-4E, if the channel identifying code $B_1$, $B_2$-$B_{14}$ being received by the pulse-width modulator 91 is (00000000000010), the coincidence of that channel identifying code with the circulating code $A_1$, $A_2$-$A_{14}$ occurs, during each circulating period of the circulating code, at the commencement of the first pulse $A_2$, so that the resulting output pulse $P_W$ obtained during each circulating period has a width of $2\tau$. Similarly, as shown at the right-hand portions of FIGS. 4A-4E, if the channel identifying code $B_1$, $B_2$-$B_{14}$ received by modulator 91 during each circulating period is (00000000000011), the coincidence of such channel identifying code with the circulating code $A_1$, $A_2$-$A_{14}$ during each circulating period of the latter occurs at the commencement of the pulse $A_1$ appearing during the existence of the first pulse $A_2$ so that the resulting output pulse $P_W$ obtained during each circulating period has a pulse-width of 3 $\tau$.

Thus, the output pulses $P_W$ produced by modulator 91 during the successive circulating periods T of the circulating code $A_1$, $A_2$-$A_{14}$ have their pulse-widths determined by the channel identifying code $B_1$, $B_2$-$B_{14}$ then being received by the modulator, and the low pass filter 92 is effective to smooth such output pulses $P_W$ from modulator 91 and to deliver an analog or DC voltage having a value that corresponds to the width of the pulses $P_W$.

In the electronic tuner 100 a signal $V_H$, $V_L$ or U received from decoder 53 of memory 50 selects either the high band or the low band of a vhf tuning section or the uhf tuning section, respectively, for operation, with the voltage controlled variable reactance element or varactor, such as, a variable capacitance diode, of the selected tuning section being controlled by the analog or DC control voltage from low pass filter 92 for determining the receiving frequency which is applied to the video intermediate frequency amplifier circuit 110.

Figure 5:
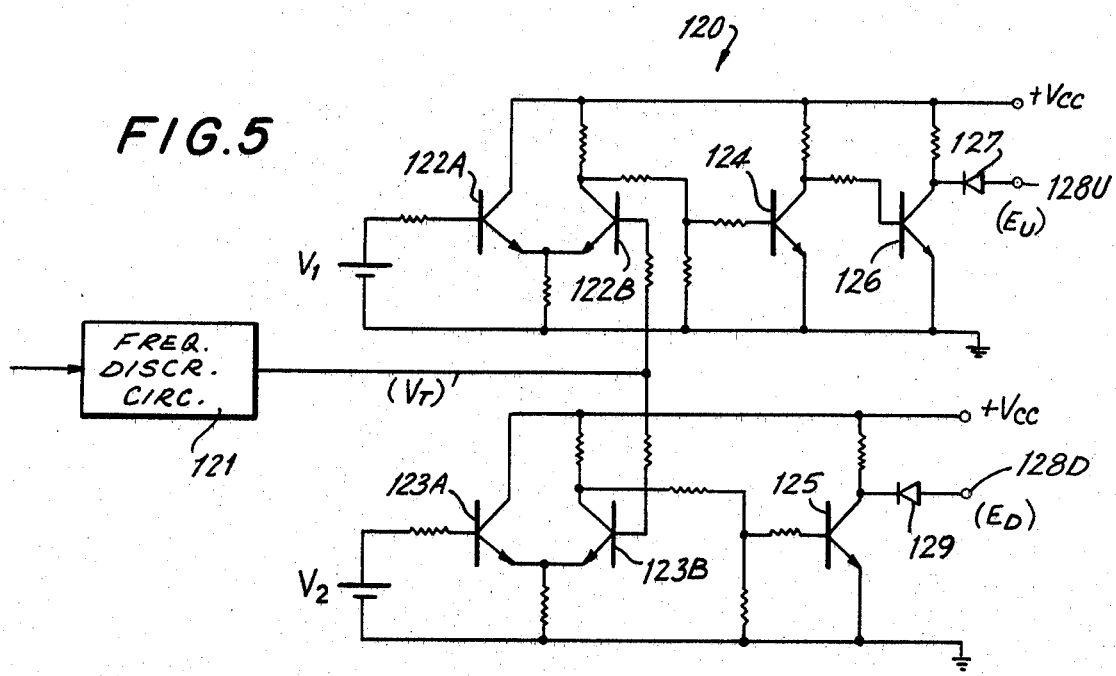
FIG. 5 is a wiring diagram showing a portion of an automatic fine tuning circuit that is included in the apparatus according to this invention.
Figure 6A:
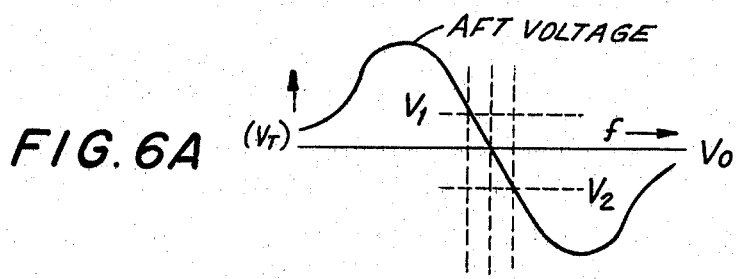

Referring now to FIG. 5, it will be seen that the AFT circuit 120 provided in accordance with this invention may comprise a conventional frequency discriminator circuit 121 which is connected to the output of the video IF amplifier 110 and provides an AFT voltage $V_T$. As shown on FIG. 6A, the AFT voltage $V_T$ has a predetermined value $V_o$ when the video intermediate frequency $f$ has the correct value $f_o$, and the AFT voltage $V_T$ varies from the value $V_o$ in accordance with a generally S-shaped curve for values of the video intermediate frequency above and below the value $f_o$. The AFT circuit 120 is further shown to comprise transistors 122A and 122B constituting a first differential amplifier, and transistors 123A and 123B constituting a second differential amplifier. Reference voltages $V_1$ and $V_2$ having values to satisfy the inequality $V_1 > V_o > V_2$ are respectively applied to the base electrodes of transistors 122A and 123A, while the AFT voltage $V_T$ from circuit 121 is applied to the base electrodes of transistors 122B and 123B. Further, the collector outputs of transistors 122B and 123B are applied to the base electrodes of transistors 124 and 125, respectively, and the collector output of transistor 124 is applied, in turn, to the base electrode of a transistor 126. Finally, the collector output of transistor 126 is devliered through a diode 127 to an output terminal 128U to provide the discriminated output $E_U$ at the latter, and the collector output of transistor 125 is delivered through a diode 129 to an output terminal 128D to provide the discriminated output $E_D$ at the latter.

Figure 6B:
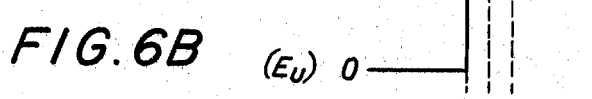
Figure 6C:
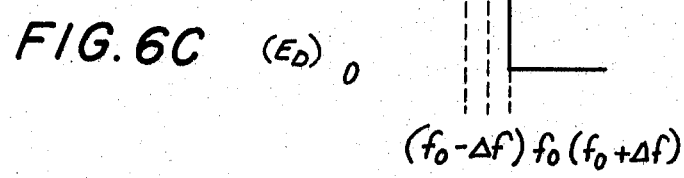

When the AFT voltage $V_T$ is larger than the reference voltage $V_1$, that is, when the video intermediate frequency from amplifier 110 is less than $(f_o - \Delta f)$, transistors 122A and 122B are respectively non-conductive and conductive. Therefore, transistor 124 is turned OFF so as to turn ON the transistor 126 and, as the result of the foregoing, the discriminated output $E_U$ becomes "0", as shown on FIG. 6B. On the other hand, transistor 123B is turned ON thereby to make transistor 125 non-conductive, so that the discriminated output $E_D$ becomes "1", as shown on FIG. 6C.

If the video intermediate frequency from amplifier 110 is in the range between the frequencies $(f_o - \Delta f)$ and $(f_o + \Delta f)$, that is, within the normal tuning range, the AFT voltage from circuit 121 is between $V_1$ and $V_2$ and, therefore, transistor 123B remains ON and the discriminated output $E_D$ continues to be "1". However, with $V_T$ being less than $V_1$, transistor 122B is turned OFF and, as a result, transistor 126 is made non-conductive so that the discriminated output $E_U$ becomes "1".

Finally, when the AFT voltage $V_T$ from frequency discriminating circuit 121 is less than $V_2$, that is, when the video intermediate frequency from amplifier 110 is greater than $(f_o + \Delta f)$, the discriminated output $E_U$ remains "1", but transistor 123B is turned OFF so as to make transistor 125 conductive and, as a result thereof, the discriminated output $E_D$ becomes "0".

In the case of a channel selecting apparatus according to this invention for a color television reciever, the reference voltages $V_1$ and $V_2$ of AFT circuit 120 are suitably selected so that $\Delta f$ will be about 50 kHz. In the normal tuned condition, that is, when the frequency $f$ is in the range between $f_o - 50$ kHz and $f_o + 50$ kHz, the discriminated outputs $E_U$ and $E_D$ are both "1" and no correction is to be made in the binary code $B_1$, $B_2$-$B_{14}$ applied to pulse width modulator 91 which determines the local oscillation frequency established in tuner 100. On the other hand, when $f$ is less than $f_o - 50$ kHz, the resulting "0" state of discriminated output $E_U$ is effective in sweep pulse generating circuit 30 (FIG. 1) to cause the latter to provide upward correction pulses which are counted by counter 40 for modifying the binary code $B_1$, $B_2$-$B_{14}$ so as to raise the local oscillation frequency and thereby bring the receiver to the normal or correct tuned condition. Conversely, if the frequency $f$ is greater than $f_o + 50$ kHz, the resulting "0" state of the discriminated output $E_D$ is effective, in sweep pulse generating circuit 30 to cause downward correction pulses to be applied to counter 40 so that binary code $B_1$, $B_2$-$B_{14}$ being applied from counter 40 to pulse width modulator 91 is modified for decreasing the local oscillation frequency and thereby providing the normal or correct tuned condition of the receiver. The upward and downward correction pulses applied to counter 40 in response to the "0" states of the discriminated outputs $E_U$ and $E_D$, respectively, are the fine sweep pulses from frequency divider 35.

More particularly, reference to FIG. 1 will show that, when discriminated output $E_U$ is "0", upward correction pulses having the period of the fine sweep pulses from frequency divider 35 are applied to counter 40 by way of the circuit constituted by inverter $39_1$, NAND circuits $38_1$ and $301$, inverter 303 and NAND circuits 304 and 308. On the other hand, when the discriminating output $E_D$ is "0", downward correction pulses also having the period of the fine sweep pulses from frequency divider 35 are applied to counter 40 through the circuit constituted by inverter 39, NAND circuits $38_2$ and 302, inverter 305 and NAND circuits 306 and 309. It will be seen that, when any one of the switches 31FU, 31FD, 31CU and 31CD is manually closed, the supplying of up-sweep pulses or down-sweep pulses to counter 40 from circuit 30 in response to the closing of such switch is preferential, that is, the resulting signal applied to each of NAND circuits $38_1$ and $38_2$ through NAND circuit 36 and inverter 37 prevents the passage of any correction pulse through NAND circuit $38_1$ or $38_2$ even though the discriminated output $E_U$ or $E_D$ may then be "0".

Figure 7A:
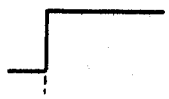

In order to inhibit or prevent the AFT operation of the channel selecting apparatus according to this invention during the operation of address selecting circuit 70 for activating a selected one of the addresses or memory units in memory 50 in a programming or channel selecting mode of the apparatus, the AFT inhibiting circuit 140 is shown to include a NAND circuit 141 receiving the collector outputs of transistors 46 and 77, a monostable multivibrator 142 which is triggered by the rising edge of the output from NAND circuit 141 (FIG. 7A) to produce a positive pulse $M_1$ (FIG. 7B) having a pulse width of, for example, 10 m.sec. The pulse $M_1$ is further applied to an inverter 143 to produce a negative inhibit pulse $P_G$ (FIG. 7C) which, as previously mentioned, is applied to NAND circuits 308 and 309 of sweep pulse generating circuit 30. Thus, during the existence or occurrence of the negative inhibit pulse $P_G$, the applying of upward or downward correction pulses through NAND circuit 308 or 309, respectively, to counter 40 is prohibited.

In the illustrated embodiment of this invention, the memory rewriting circuit 130 is shown to comprise a monostable multivibrator 131 which is triggered by the falling edge of an output $M_1$ from monostable multivibrator 142 to produce an output $M_2$ (FIG. 7D) which, at its falling edge, triggers a monostable multivibrator 132 to produce an output $M_3$ (FIG. 7E) and further to reset a counter 133. The up- and down-sweep pulses $P_{UD}$ applied by circuit 30 to counter 40 are also applied through OR circuit 310 to a NAND circuit 134 which also has applied thereto the output $M_2$ of monostable multivibrator 131. Further, the signal $P_A$ from mode change-over switch 61 of memory control circuit 60 is applied through an inverter 135 to NAND circuit 134. Thus, the up- and down-sweep pulses $P_{UD}$ are passed through NAND circuit 134 to be counted by counter 133 only upon the occurrence of the output $M_2$, that is, when the inhibit pulse $P_G$ has been terminated to indicate that the operation of address selecting circuit 70 for activating one of the memory units or addresses of memory 50 has been completed, and further only when mode change-over switch 61 engages its fixed contact $b$ for providing the signal or output $P_A$ with the value "0" for establishing the channel selecting mode of operation of the apparatus.

Figure 7G:

It will be apparent from the above that, after each operation of address selecting circuit 70 with the apparatus in its channel selecting mode so that the channel identifying code stored at the selected address of memory 50 is read out to counter 40 and the latter applies the corresponding binary code $B_1$, $B_2$-$B_{14}$ to pulse width modulator 91 for establishing a respective receiving frequency, any operation of AFT circuit 120 for causing circuit 30 to apply upward or downward correcting pulses to counter 40 for modifying the code $B_1$, $B_2$-$B_{14}$ so as to obtain the normal or correct tuned condition also results in such upward or downward correcting pulses being counted by counter 133. In the memory rewriting circuit 130, a decoder 136 is associated with counter 133 and is operative, when counter 133, after being reset by the rising side of pulse or output $M_2$, has counted $n$ upward or downward correcting pulses $P_{UD}$ (FIG. 7F), to provide an output "1" (FIG. 7G) on its output line $L_n$ by which the flip-flop 137 is set to provide an output $M_4$ (FIG. 7H). The flip-flop 137 is reset by the falling side of output $M_3$ from monostable multivibrator 132 so as to terminate the output $M_4$. Finally, the outputs $M_3$ and $M_4$ are applied to a NAND circuit 138 which provides the rewriting instruction $P_M$ having the value "0" (FIG. 7I) during the simultaneous occurrence of outputs $M_3$ and $M_4$. The application of the rewriting instruction $P_M$ to NAND circuit 66 in memory control circuit 60 with the apparatus in its channel selecting mode has substantially the same effect as the closing of the writing switch 62 when the apparatus is in its programming mode. In other words, the application of the rewriting instruction $P_M$ to NAND circuit 66 causes instruction signal forming circuit 65 to supply an erasing pulse $P_E$ and then a writing pulse $P_{WR}$ to the selected memory unit in memory 50 so as to erase the channel identifying code $B_1$, $B_2$-$B_{14}$ previously stored in that memory unit and to write, in place of such channel identifying code, the modified channel identifying code which is then established by counter 40 following the AFT operation. If, for example $n+1$ correction pulses are applied to counter 40 in response to an AFT operation for achieving the normal or correct tuned condition when a channel identifying code is read out of a selected one of the memory units of memory 50, the resulting modified channel identifying code is rewritten in the same memory unit in place of the original channel identifying code. Of course, if less than $n$ correction pulses are applied to counter 40 in response to an AFT operation, flip-flop 137 is not set and, therefore, the rewriting instruction $P_M$ is not obtained, with the result that the channel identifying code originally written or programmed in the respective memory unit of memory 50 remains unchanged therein.

The above described channel selecting apparatus according to this invention operates as follows:

PROGRAMMING MODE OF OPERATION

When it is desired to program the channel selecting apparatus, that is, to store at the various addresses in memory channel identifying codes corresponding to various channels that are receivable in the region where the television receiver is located so that, thereafter, such channels can be received or selected merely by actuation of the switches $S_1$-$S_{16}$ corresponding to the respective addresses, the mode change-over switch 61 is engaged with its fixed contact $a$ for selecting the programming mode of operation. If it is desired, for example, to store at the address or memory unit $51_1$ of memory 50 a channel identifying code corresponding to the receiving frequency for channel "one" in the Tokyo area of Japan, the address selecting switch $S_1$ is manually closed. Closing of switch $S_1$ turns ON transistor 77 in address selecting circuit 70 so that the collector output of such transistor has the value "0". Thus, the output of inverter 78 becomes "1" with the result that NAND circuit 79 provides a "0" output on receiving each of the pulses $A_9$ from timing counter 20. The address counter 71 counts each of the "0" outputs from NAND circuit 79. When the resulting 4-bit code from address counter 71 corresponds to the address or memory unit $51_1$ selected by the closing of switch $S_1$, the decoder 72 responds to such 4-bit code from address counter 71 to provide a "0" output on the corresponding output line $L_1$. In response to such "0" output on line $L_1$, transistor 77 is turned OFF with the result that the output of NAND circuit 79 remains at "1" and address counter 71 ceases counting. Accordingly, the 4-bit code corresponding to switch $S_1$ is applied to memory 50 for selecting or activating the address or memory unit $51_1$ corresponding to switch $S_1$.

Since channel "one" in the Tokyo area, that is, a low vhf channel, is to be programmed in memory unit $51_1$, switch $S_L$ of the band indicating signal forming circuit 80 is closed to provide an output "1" from the respective inverter $82_L$. Since mode change-over switch 61 is engaged with its fixed contact $a$, its output $P_A$ is "1" and, therefore, the output of NAND circuit $83_L$ becomes "0". Band memory 84 responds to such "0" output from NAND circuit $83_L$ to provide the band selecting pulse $P_L$ which, through encoder 52 and decoder 53 of memory 50 provides the signal $V_L$ for selecting the low band or channel of the vhf tuning section in tuner 100.

Having selected the address or memory unit of memory 50 at which a channel identifying code is to be programmed and the band or section of tuner 100 which is appropriate for the channel to be programmed at such selected address, the sweep pulse generating circuit 30 is made operative, for example, by manually actuating the coarse up-sweep switch 31CU and holding the latter in its closed position. The closing of switch 31CU causes the associated inverter $33_3$ to provide the output "1" to NAND circuit $34_3$. Therefore, at each "0" state of the pulses $A_{14}$ from timing counter 20, which pulses have a period of 4.096 m.sec., NAND circuit $34_3$ provides an output "1". Since the fine up-sweep switch 31FU is open, the output of its associated inverter $33_1$ is "0" and the output of the respective NAND circuit $34_1$ is "1". Therefore, the output of the NAND circuit 36 becomes "0" at every "1" output from NAND circuit $34_3$, that is, at every "0" state of the pulses $A_{14}$. Accordingly, an up-sweep pulse $P_U$ appears at the output of inverter 37 at every "0" state of the pulses $A_{14}$ from timing counter 20. Since such pulses $A_{14}$ have a relatively short period of 4.096 m.sec., the pulses $P_U$ appearing while switch 31 CU is held in its closed condition may be considered coarse up-sweep pulses which, when being counted by counter 40, cause relatively rapid changes in the count of such counter 40. In other words, when counting the coarse up-sweep pulses $P_U$ from generating circuit 30, the counte of counter 40 is changed, in sequence, in the upward direction to similarly change the resulting channel identifying code $B_1$, $B_2$-$B_{14}$ obtained from counter 40 at every circulating period of the circulating code $A_1$, $A_2$-$A_{14}$ from timing counter 20, starting from the state (00000000000000), as shown on FIG. 4C. The changing channel identifying code from counter 40 and the circulating code from timing counter 20 are applied to pulse-width modulator 91 in the programming mode of operation. Since the circulating code $A_1$, $A_2$-$A_{14}$ changes at every time $\tau = 0.25$ $\mu$ sec. which is the width of the pulses $A_1$, the width of the output pulse $P_W$ from modulator 91 is increased by $\tau$ at every circulating period T of the circulating code starting from a pulse width of zero. Thus, so long as switch 31CU of sweep pulse generating circuit 30 is held in its closed condition, the channel selecting or control voltage from low pass filter 92 is increased progressively, for example, by about 2 m.V at every period T=4.096 m.sec. of the circulating code, and hence the receiving frequency established by tuner 100 increases progressively.

When a video picture being broadcast or transmitted by channel "one" appears on the screen of the television receiver, the coarse up-sweep switch 31CU is released by the operator so as to return to its normal open condition. Upon opening of switch 31CU, the supplying of the coarse up-sweep pulses $P_U$ to counter 40 is terminated so that counter 40 ceases its counting action and the channel identifying code $B_1$, $B_2$-$B_{14}$ then obtained from counter 40 determines the approximate value of the receiving frequency of tuner 100 for the desired channel. Thereafter, the fine up-sweep switch 31FU may be manually actuated and held in its closed condition to provide fine up-sweep pulses $P_U$ from inverter 37, which fine up-sweep pulses by reason of the divider 35. In counting the fine up-sweep pulses, the counter 40 sequentially changes the resulting channel identifying code $B_1$, $B_2$-$B_{14}$ at every period 64T=262.144 m.sec. Thus, the width of the output pulses $P_W$ from pulse-width modulator 91 is increased by $\tau$ at every period 64T and, accordingly, the channel selecting or control voltage from low pass filter 92 is increased by about 2 mV at every period 64T for similarly changing the receiving frequency determined by tuner 100. When viewing of the picture on the screen of the television receiver indicates that fine tuning has been achieved in respect to the video signal broadcast by the desired channel, switch 31FU is released to return to its open condition and thereby halt the supplying of the fine up-sweep pulses to counter 40. Accordingly, counter 40 stops counting with the resulting channel identifying code $B_1$, $B_2$-$B_{14}$ corresponding to a value of the analog control voltage applied from digital-to-analog converter 90 to tuner 100 corresponding to a receiving frequency for the fine-tuned reception of channel "one". Of course, in the illustrated embodiment of the invention, after switch 31CU and/or switch 31FU have been selectively closed to bring the receiving frequency established by the code $B_1$, $B_2$-$B_{14}$ produced by counter 40 to within the so-called pull-in range of AFT circuit 120, the above described AFT operation may be relied upon to further modify such code for obtaining the normal or correct tuned condition for the channel being programmed.

After the normal or correct tuned condition has been realized, either by selective actuation of switches 31CU and 31FU, or by a combination of actuation of such switches and the AFT operation, the writing switch 62 is manually closed so that the associated inverter 64 provides the output "1". Since the mode change-over switch 61 remains engaged with its fixed contact $a$ to provide the output $P_A$ with the value "1", the NAND circuit 63 provides the output "0". As a result of such "0" output from NAND circuit 63, the instruction signal forming circuit 65 first supplies an erasing pulse $P_E$ to memory 50 so as to erase any contents previously stored in the memory unit $51_1$ selected by the closing of switch $S_1$. Then, circuit 65 applies a writing pulse $P_{WR}$ to memory unit $51_1$ with the result that the channel identifying code $B_1$, $B_2$-$B_{14}$ established by counter 40 for fine-tuning of channel "one" and the band identifying signal $P_L$ from band memory 84 are then written in the respective cells of memory unit $51_1$.

Following the programming of memory unit $51_1$ with a channel identifying code and a band indicating code corresponding to channel "one", the other memory units $51_2$-$51_{16}$ of memory 50 may be similarly programmed with coded information corresponding to other vhf and/or uhf channels that are receivable in the region where the television receiver is located.

Although the programming of the channel selecting apparatus according to this invention has been desdribed above as being effected by the sequential closing of the coarse up-sweep switch 31CU and the fine up-sweep switch 31FU, in which case, the coarse or fine up-sweep pulses $P_U$ are counted in the upward direction by counter 40 for progressively increasing the receiving frequency of tuner 100, it will be apparent that the programming operations can be similarly effected by the successive closing of the coarse down-sweep switch 31CD and the fine down-sweep switch 31FD so that counter 40 is made to count in the downward direction for progressively decreasing the receiving frequency of tuner 100. Whether counter 40 is made to count in the upward direction or in the downward direction, as aforesaid, is merely dependent upon the relationship of the receiving frequency for a channel which is to be programmed relative to the receiving frequency for the channel which has been previously programmed and, in each case, the direction in which counter 40 is made to count is selected so as to minimize the time required for the programming operation.

CHANNEL SELECTING MODE OF OPERATION

After the programming of memory 50 has been completed, as described above, the mode change-over switch 61 is manually actuated to engage its fixed contact b and thereby provide the output $P_A$ with the value "0" for establishing the channel selecting mode of operation for the apparatus. Since writing switch 62 remains in its open position, the output of the associated inverter 64 is "0" and, accordingly, NAND circuit 63 provides the output "1" to instruction signal forming circuit 65 so that the latter supplies the reading pulse $P_R$ to memory 50.

Preferably, when the power source for the channel selecting apparatus is initially turned ON, the address counter 71 of address selecting circuit 70 is reset thereby so that the 4-bit code issuing from counter 71 will activate or address the memory unit $51_1$ in memory 50.

When the power source for the channel selecting apparatus is initially turned ON, the transistor 46 in time constant circuit 47 is made conductive so that its collector output is "0" for a predetermined period of, for example, 50 m.sec., whereupon transistor 46 is turned OFF and its collector output rises to the value "1". Such rise in the collector output of transistor 46 triggers the monostable multivibrator 45 to provide an output pulse from the latter at the level "1" for the predetermined time of 50 m.sec. Since the output $P_A$ from mode change-over switch 61 is "0" for the channel selecting mode of operation, the output from inverter 43 is "1" and, therefore, the output from NAND circuit 44 is "0" for the predetermined time or period of the output pulse from monostable multivibrator 45. Such "0" output from NAND circuit 44 causes the inverter 48 to produce the output "1", that is, the load pulse $P_B$ for the period of the output pulse from monostable multivibrator 45. The load pulse $P_B$, when applied to AND circuits $42_1$–$42_{14}$ in counter 40, allows the read out to counter 40 from memory unit $51_1$ of the channel identifying code $C_1$, $C_2$–$C_{14}$ previously stored therein and which, in the example described above, represents channel "one" in the Tokyo area. At the same time, the band indicating code stored in the respective cells of memory unit $51_1$ is read out from the latter to decoder 53 so that, in the described example, the signal $V_L$ is applied to tuner 100 for selecting the low band of the vhf tuning section. During the existence of load pulse $P_B$, the bits $C_1$–$C_{14}$ of the read out channel identifying code are applied to the respective flip-flops $41_1$–$41_{14}$ of counter 40 with the result that such flip-flops assume the states for providing the channel identifying code $B_1$–$B_{14}$ from counter 40 to pulse-width modulator 91 which, during programming, was determined to correspond to a control voltage for tuner 100 suitable for fine tuning of the receiving frequency to that of channel "one". Therefore, upon the initial supplying of power to the channel selecting apparatus, the latter tunes the television receiver for the reception of the channel which has been programmed into the first address or memory unit $51_1$ of memory 50.

Thereafter, if it is desired to receive a channel programmed in a memory unit of memory 50 other than the first address or memory unit $51_1$, for example, if it is desired to receive channel "three" which has been programmed in the second memory unit $51_2$, the switch $S_2$ of the address selecting circuit 70 is manually closed and, as previously described in connection with the programming mode of operation, the address counter 71 counts the pulses $A_9$ until the 4-bit code from address counter 71 addresses the second memory unit $51_2$ for causing read out of the channel identifying code and band indicating code stored in that memory unit during the programming of channel "three" in memory unit $51_2$. When the code from address counter 71 addresses the memory unit corresponding to closed switch $S_2$, decoder 72 provides the signal "0" on the respective output line $L_2$ so that transistor 77 is turned OFF and its collector output rises from "0" to "1". Such rise in the collector output of transistor 77 triggers monostable multivibrator 45 and, as previously described, the output from monostable multivibrator 45 results in the production of a load pulse $P_B$ from inverter 48. In response to the load pulse $P_B$, the channel identifying code being read out of memory unit $51_2$ correspondingly changes the states of the flip-flops of the counter 40 so that the latter provides the corresponding channel identifying code $B_1$, $B_2$–$B_{14}$ to pulse width modulator 91. Therefore, the output pulse $P_W$ obtained from modulator 91 during each circulating period of the circulating code $A_1$, $A_2$–$A_{14}$ has its width determined by the channel identifying code so as to result in an analog control voltage from low pass filter 92 to tuner 100 sufficient to cause the latter to establish the receiving frequency for channel "three".

It will be apparent that the channels programmed in the other memory units $51_3$–$51_{16}$ may be similarly selectively received merely by manual closing of a respective one of the address selecting switches $S_1$–$S_{16}$.

Although memory 50 is initially programmed with channel identifying codes $B_1$, $B_2$–$B_{14}$ which, when selectively applied to pulse width modulator 91, provide control voltages to the varactor of tuner 100 for obtaining the receiving frequency or normal tuned condition for the respective channels, with time, a shift from such normal tuned condition may occur due to a temperature drift, annual variation or the like in the electronic tuning tuner 100. In other words, at some time after the programming of a memory unit in memory 50 with a channel identifying code, the control voltage for tuner 100 that results from the application of the programmed code to digital-to-analog converter 90 in the channel selecting mode of the apparatus may no longer produce the receiving frequency for the normal tuned condition of the respective channel. In that event, AFT circuit 120 provides a discriminated output $E_U$ or $E_D$ to cause circuit 30 to apply upward or downward correcting pulses to counter 40 for modifying the channel identifying code $B_1$, $B_2$–$B_{14}$ applied from counter 40 to converter 90 until the normal tuned condition is restored, as previously described.

It should be noted that the foregoing AFT operation in the channel selecting mode of the apparatus is delayed to commence a predetermined time after power is first applied to the apparatus, or after a selected one of the switches $S_1$, $S_2$–$S_{16}$ is closed for selecting a respective one of the memory units in memory 50 for read out of the channel identifying code stored therein. More particularly, when the power source for the apparatus is initially turned ON, or when one of the switches $S_1$-$S_{16}$ is closed, the resulting collector output of transistor 46 or transistor 77, respectively, triggers monostable multivibrator 142 to provide the inhibit pulse $P_G$ for 10 m.sec. During that period of time, the inhibit pulse $P_G$ prevents upward or downward correction pulses from reaching counter 40 even though AFT circuit may then be providing the discriminated output $E_U$ or $E_D$. Thus, the onset of the AFT operation is delayed until the address selecting circuit 70 has completed the previously described operations of selecting the first memory unit 51, in memory 50 in response to the initial connection of the apparatus to its power source, or of selecting some other memory unit in response to the closing of respective one of switches $S_1$-$S_{16}$, and until the control voltage applied to tuner 100 has attained a level corresponding to the channel identifying code being read out of the selected memory unit. The foregoing delay in the onset of the AFT operation avoids the possibility that the AFT operation will seek to pull-in the local oscillation frequency at some region other than the desired normal tuned condition if the AFT operation is permitted when power is first applied to the apparatus or when circuit 70 is changing over from the selection of one to another of the addresses in memory 50.

When the AFT operation does not occur with the apparatus in its channel selecting mode, the upward or downward correction pulses $P_{UD}$ applied to the counter 40 for modifying the code $B_1$, $B_2$-$B_{14}$ applied from the latter to digital-to-analog converter 90 so as to obtain the normal tuned condition, are also counted by counter 133. When the number of such upward or downward correction pulses reaches $n$, that is, when the receiving frequency resulting from the channel identifying code stored in the selected memory unit of memory 50 is at least 50 kHz greater than or less than the local oscillation frequency for the normal or correct tuned condition, but still within the pull-in range of the AFT circuit, the memory rewriting circuit 130 provides the rewriting instruction $P_M$. As previously described, such rewriting instruction causes the modified channel identifying code $B_1$, $B_2$-$B_{14}$ then produced by counter 40 to be written in the selected memory unit in place of the channel identifying code previously written therein.

By reason of the above described rewriting operation, if the tuner 100 undergoes a progressive change in its control voltage-receiving frequency characteristic due to temperature drift, annual variation or the like, upon each periodic selection of each memory unit for selection of the respective channel the AFT operation provides the normal or correct tuned condition and, if at any time such AFT operation approaches the limits of its pull-in range, the code stored in the memory unit is replaced by a new code corresponding to the changed control voltage-receiving frequency characteristic of the tuner for ensuring that the pull-in range of the AFT circuit is not exceeded.

Although the rewriting operation could be effected each time the channel identifying code being read out of a memory unit is modified by the AFT operation, it is preferred that the rewriting operation occur only when the AFT correction exceeds a predetermined amount, as described above, particularly when the memory is composed of non-volatile memory cells, as such cells are, in general, limited as to number of times information can be rewritten therein.

In the illustrated embodiment of the invention, the control of the rewriting or memory refreshing operation is effected by directly counting the correction pulses $P_{UD}$ resulting from the AFT operation, and performing the rewriting operation when the number of correction pulses exceeds a predetermined value. However, in the apparatus according to this invention, other means may be employed for controlling the rewriting or memory refreshing operation. For example, a buffer (not shown) may be provided separate from the counter 40 to store the channel identifying code being read out of a selected memory unit, whereupon the contents of the counter 40, after the same are modified by an AFT operation, are compared with the contents stored in the buffer to cause the rewriting operation to occur when the compared contents differ from each other by at least a predetermined value.

Further, the pulse width modulator 91 and low-pass filter 92 provided in the illustrated embodiment for converting the digital channel identifying codes into respective control voltages for the tuner 100 can be replaced by any other digital-to-analog converter, for example, consisting of switching elements and weighted resistors for achieving the same result.

It is further to be noted that the present invention avoids a serious problem encountered in effecting AFT operation in connection with an electronic tuning tuner employing a varactor as its tuning element. Such varactors or variable capacitance diodes have non-linear voltage-capacitance characteristics. In other words, as the receiving frequency is increased, progressively increasing changes in the control voltage are required to effect unit or incremental changes in the receiving frequency. Therefore, the change in the control voltage required to effect a predetermined change in the receiving frequency is different for each of the channels. Therefore, in the existing AFT circuits associated with electronic tuning tuners, the correction or AFT sensitivity has had to be different or changed-over for each of the channels so that the construction of the AFT circuit becomes undesirably complex.

As distinguished from the foregoing, in the channel selecting apparatus according to the invention, the AFT circuit 120 merely indicates by its discriminated outputs $E_U$ and $E_D$ the direction of the necessary change in the control voltage for achieving the normal tuned condition. Therefore, the AFT operation can be simply and accurately performed in a wholly automatic fashion.

Although an illustrative embodiment of the invention has been described in detail herein with reference to the accompanying drawings, it is to be understood that the invention is not limited to that precise embodiment, and that various changes and modifications may be effected therein by one skilled in the art without departing from the scope or spirit of the invention as defined in the appended claims.

What is claimed is:

1. A channel selecting apparatus for a television receiver having an electronic tuning tuner for changing the receiving frequency in accordance with an analog control signal applied thereto; said channel selecting apparatus comprising memory means having a plurality of addresses for storing respective digital codes each identifying a respective channel, addressing means actuable for selectively activating each of said addresses in the memory means so as to effect read out of the respective channel identifying digital code, digital-to-analog converting means for converting the digital code being read out of said memory means into a respective analog control signal for said tuner, automatic fine tuning means which includes means for detecting deviation of the receiving frequency, as established in response to said analog control signal, from the correct receiving frequency for the channel identified by the digital code then being read out of said memory means, and means responsive to a detected deviation of said established receiving frequency from said correct receiving frequency for modifying the channel identifying digital code being converted by said converting means in the sense for removing said deviation, and means operative, when said deviation exceeds a predetermined amount, to store the resulting modified digital code in said memory means in place of the read out digital code resulting in said deviation.

2. A channel selecting apparatus for a television receiver having an electronic tuning tuner for changing the receiving frequency in accordance with an analog control signal applied thereto; said channel selecting apparatus comprising means for producing a circulating digital code at a predetermined repetition rate, memory means having a plurality of addresses for storing respective digital codes each identifying a respective channel, addressing means actuable for selectively activating each of said addresses in the memory means so as to effect read out of the respective channel identifying digital code, digital-to-analog converting means, for converting the digital code being read out of said memory means into a respective analog control signal for said tuner, which includes pulse-width modulator means operative to produce a chain of pulses at said predetermined repetition rate with the width of each of said pulses being dependent on said selected digital code read out of said memory means, said pulse-width modulator means receiving said circulating digital code and determining said pulse width in dependence on the absence of coincidence between said selected digital code read out of said memory means and said circulating digital code, and low-pass filter means receiving said chain of pulses from said modulator means for providing said analog voltage to control said variable reactance device in dependence on said width of the pulses, and automatic fine tuning means which includes means for detecting deviation of the receiving frequency, as established in response to said analog control signal, from the correct receiving frequency for the channel identified by the digigal code then being read out of said memory means, and means responsive to a detected deviation of said established receiving frequency from said correct receiving frequency for modifying the channel identifying digital code being converted by said converting means in the sense for removing said deviation.

3. A channel selecting apparatus for a television receiver having an electronic tuning tuner for changing signal applied thereto; said channel selecting apparatus comprising memory means having a plurality of addresses for storing respective digital codes each identifying a respective channel, sweep pulse generating means for generating sweep pulses, counting means for counting said sweep pulses and providing said digital codes in correspondence with the changing count of said counting means, means for writing selected digital codes from said counting means at selected addresses in said memory means, addressing means actuable for selectively activating each of said addresses in the memory means so as to effect read out of the respective channel identifying digital code, digital-to-analog converting means for converting the digital code being read out of said memory means into a respective analog control signal for said tuner, and automatic fine tuning means which includes means for detecting deviation of the receiving frequency, as established in response to said analog control signal, from the correct receiving frequency for the channel identified by the digital code then being read out of said memory means, means responsive to a detected deviation of said established receiving frequency from said correct receiving frequency for controlling the production of correction pulses, and means for causing said sweep pulse generating means to produce said correction pulses counted by said counting means for changing the count of the latter and thereby modifying the channel identifying digital code converted by said digital-to-analog converting means.

4. A channel selecting apparatus according to claim 3; in which said means for writing the digital codes at said selected addresses in the memory means includes memory control means selectively disposable in a programming mode and a channel selecting mode, and write control means operable, when said memory control means is in said programming mode, to cause writing at said address in said memory means then activated by said addressing means of the digital code being received from said counting means; and in which said memory control means, when in said channel selecting mode, adapts the count of said counting means to the channel identifying digital code being read out from the address in said memory means which is then activated by said addressing means.

5. A channel selecting apparatus according to claim 4; further comprising rewriting means operative in said channel selecting mode, when said deviation exceeds a predetermined amount, to rewrite, at the address in said memory means then activated by said addressing means, the resulting modified digital code in place of said channel identifying digital code being read out from said activated address.

6. A channel selecting apparatus according to claim 5; further comprising inhibit means operative upon actuation of said addressing means for delaying, for a predetermined time thereafter, any operation of said automatic fine tuning means and of said rewriting means.

7. A channel selecting apparatus according to claim 5; in which said rewriting means includes second counting means for counting said correction pulses applied to the first mentioned counting means, and means for providing a rewrite instruction signal to said memory control means when the correction pulses counted by said second counting means exceed a predetermined number.

8. A channel selecting apparatus according to claim 3; in which said sweep pulse generating means includes selectively actuable switch means for causing the production of sweep pulses to be counted up by said counting means and the production of sweep pulses to be counted down by said counting means, respectively.

9. A channel selecting apparatus according to claim 8; in which said sweep pulse generating means further includes selectively actuable switch means for causing said sweep pulses to be generated with a relatively short period and with a relatively long period, respectively, so that said counting means effects relatively fast and slow changes in said digital codes when counting said sweep pulses with said relatively short and long periods, respectively.

10. A channel selecting apparatus according to claim 9; further comprising means to prevent the application of said correction pulses to said counting means when any of said switch means is actuated.

11. A channel selecting apparatus according to claim 3; in which said automatic fine tuning means includes means for producing first and second discriminated outputs when said established receiving frequency is above and below, respectively, said correct receiving frequency by a predetermined amount, and means for causing said sweep pulse generating means to produce said correction pulses to be counted down and up, respectively, by said counting means in response to said first and second discriminated outputs, respectively.

12. A channel selecting apparatus according to claim 11; further comprising rewriting means counting said correction pulses, and means operative, when the counted correction pulses exceed a predetermined number, to write the resulting modified channel identifying digital code in said memory means in place of the read out digital code resulting in said detected deviation.

* * * * *